(12) United States Patent
Kim et al.

(10) Patent No.: US 6,673,668 B2
(45) Date of Patent: Jan. 6, 2004

(54) METHOD OF FORMING CAPACITOR OF A SEMICONDUCTOR MEMORY DEVICE

(75) Inventors: Kyong-Min Kim, Ichon-shi (KR); Han-Sang Song, Ichon-shi (KR); Ki-Seon Park, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/166,632

(22) Filed: Jun. 12, 2002

(65) Prior Publication Data

US 2003/0008456 A1 Jan. 9, 2003

(30) Foreign Application Priority Data

Jun. 12, 2001 (KR) .................................. 2001-0032686

(51) Int. Cl.⁷ .......................................... H01L 21/8242
(52) U.S. Cl. ........................................ 438/240; 438/381
(58) Field of Search ................................ 438/238–240, 438/3, 381, 393–399, 250–256

(56) References Cited

U.S. PATENT DOCUMENTS

| 5,886,368 | A | 3/1999 | Forbes et al. |
| 5,926,740 | A | 7/1999 | Forbes et al. |
| 5,985,730 | A | 11/1999 | Lim et al. |
| 6,015,917 | A | 1/2000 | Bhandari et al. |
| 6,031,263 | A | 2/2000 | Forbes et al. |
| 6,057,628 | A | 5/2000 | Viljoen et al. |
| 6,127,277 | A | 10/2000 | DeOrnellas et al. |
| 6,144,060 | A | 11/2000 | Park et al. |
| 6,166,401 | A | 12/2000 | Forbes et al. |
| 6,576,528 | B1 * | 6/2003 | Lee |

FOREIGN PATENT DOCUMENTS

KR     1020000007465     2/2000

* cited by examiner

Primary Examiner—Jey Tsai
(74) Attorney, Agent, or Firm—Birch, Stewart, Kolasch & Birch, LLP

(57) ABSTRACT

A capacitor having a tantalum-contained-dielectric layer is formed by a fabrication method including the steps of: forming a lower electrode on a semiconductor substrate; forming a dielectric layer containing Ta element on the lower electrode; forming a first TiN layer of an upper electrode on the dielectric layer by using atomic layer deposition; forming an oxidized TiN layer by performing an oxidation process on the dielectric layer; and forming a second TiN layer of the upper electrode on the oxidized TiN layer by using a plasma vapor deposition (PVD).

19 Claims, 3 Drawing Sheets

METHOD OF FORMING CAPACITOR OF A SEMICONDUCTOR MEMORY DEVICE

This nonprovisional application claims priority under 35 U.S.C. §119(a) on Patent Application No. 2001-32686 filed in Korea on Jun. 12, 2001, which is herein incorporated by reference.

FIELD OF THE INVENTION

The present invention relates to a method for fabricating a semiconductor memory device; and more particularly, to a method for fabricating a capacitor of the semiconductor memory device.

DESCRIPTION OF THE PRIOR ART

A Dynamic Random Access Memory (DRAM) cell is a semiconductor memory device typically having one transistor and one capacitor, in which one bit of data is stored in a cell using an electric charge.

A capacitor has a lower electrode, a dielectric layer, and an upper electrode. One electrode of the lower electrode and the upper electrode is connected to the source/drain junction of the transistor, and the other electrode is connected to a reference voltage line.

As the integration of the DRAM is increased, the size of the memory cell is decreased. However, it is impossible to reduce the size of the memory cell in proportion to the reduction of the DRAM size, because an adequate amount of the capacitance is needed to prevent soft error and to maintain stable operation. There have been efforts to obtain adequate capacitance by reducing the thickness of the dielectric layer, increasing the effective area and using material having a high dielectric constant.

The dielectric layer of a conventional capacitor is formed with a $SiO_2$ layer, a nitride-oxide (NO) layer or an oxide-nitride-oxide (ONO) layer. The NO layer and the ONO layer are formed with a $Si_3N_4$ layer of which the dielectric constant is two times as high as that of the $SiO_2$ layer.

However, it is impossible to obtain high capacitance from the $SiO_2$ layer, $Si_3N_4$ layer, NO layer and ONO layer because of the low dielectric constant of the dielectric layers, even when the thicknesses of the dielectric layers are reduced and the areas are increased. Therefore, dielectric layers, such as (Ba, Sr) $TiO_3$ (hereinafter referred as BST) layer, (Pb, Zr) $TiO_3$ (hereinafter referred as PZT) layer and $Ta_2O_5$ layer, having high dielectric constant are used as a dielectric layer of the capacitor.

The dielectric constant of the $Ta_2O_5$ is about 20 to 25, which is three times as high as that of the $Si_3N_4$, and it is relatively easier to etch the $Ta_2O_5$ layer than to etch the BST layer and PZT layer. Furthermore, the $Ta_2O_5$ layer formed by the chemical vapor deposition (CVD) method has a good characteristic of step coverage. However, it is difficult to compose the $Ta_2O_5$ layer with the proper stoichiometry. Therefore, recently, a TaON layer has been suggested to overcome the stoichiometry problem of the $Ta_2O_5$ layer.

The characteristic of the $Ta_2O_5$ layer depends on the electrodes of the capacitor. A capacitor having a $Ta_2O_5$ layer as a dielectric layer has a MIS structure. Herein, "M" is a metal layer for forming the plate line; "I" is an insulating layer i.e., the dielectric layer of the capacitor; and "S" is a polysilicon layer for forming a storage electrode. The plate line of the capacitor having the $Ta_2O_5$ layer may also be formed with stacked layers of polysilicon layer/TiN layer or polysilicon layer/WN layer, and the storage electrode may also be formed with a polysilicon layer of which surface is treated with nitrogen by the rapid thermal nitration (RTN) process.

In a Metal/Insulator/Silicon (MIS) structure, the thickness of $Ta_2O_5$ can be reduced to secure proper capacitance needed in the highly integrated circuit device. The thermal treatment performed after the formation of the capacitor is important in reducing the thickness of the $Ta_2O_5$ layer. That is, if the thermal burdens of subsequent processes are relative low, then it is possible to make the $Ta_2O_5$ layer relatively thinner. The minimum thickness of the $Ta_2O_5$ layer has not clearly been proved, but the limit is presumed to be about 20–30 Å. If the thickness of the $Ta_2O_5$ layer is decreased more than the limit, the problem of increasing leakage current occurs.

To reduce the thickness of the dielectric layer, the lower electrode may be formed with a metal layer instead of a polysilicon layer. When forming the lower electrode with a metal, the native oxide, which becomes a disturbance to reduce the thickness of dielectric layer, is not formed on the surface of the lower electrode. Accordingly, it is possible to reduce the thickness of $Ta_2O_5$ layer by forming the lower electrode with metal instead of polysilicon.

However, the characteristic of the leakage current is influenced greatly by the quality of the lower electrode when the lower electrode is made with metal. Accordingly, a barrier layer should be formed under the lower electrode to prevent the reaction between the metal layer and a polysilicon plug (or a silicon substrate) and to prevent the diffusion of the oxygen used as a source for forming a dielectric layer.

In the meantime, the dielectric characteristic of the tantalum-contained-oxide layer, such as $Ta_2O_5$ and TiON, depends on the material of the upper electrode.

A Titanium-Nitride (TiN) layer is relatively stable among the conductive materials, and the TiN layer has good step coverage because the TiN layer can be formed by the chemical vapor deposition method. Therefore, a TiN layer is widely used to form the upper electrode. When forming the upper electrode with TiN, a good electric characteristic of the capacitor can be obtained when the TiN layer is formed at a relatively low temperature rather than a relatively high temperature. However, if the TiN layer is formed at a low temperature, the tantalum-contained-dielectric layer, such as $Ta_2O_5$ and TiON, is damaged by Cl radicals generated by the source material $TiCl_4$. In addition, the structure of the TiN layer formed at a low temperature is not dense, whereby deoxidized Ta elements remain at the interface between the tantalum-contained-oxide layer and the TiN layer, and the leakage current caused by the Ta elements deteriorates the electric characteristic of the capacitor.

SUMMARY OF THE INVENTION

It is, therefore, an object of the present invention to provide a method of fabricating a capacitor having a tantalum-contained-dielectric layer.

It is, therefore, another object of the present invention to provide a method of fabricating a capacitor capable of obtaining good electric characteristics and reducing damages from Cl radicals.

According to one embodiment of the present invention, there is provided a method of forming a capacitor of a semiconductor device, including the steps of: forming a lower electrode on a semiconductor substrate; forming a dielectric layer containing Ta element on the lower electrode; forming a first TiN layer of an upper electrode on the dielectric layer by using atomic layer deposition; forming an oxidized TiN layer by performing an oxidation process on the dielectric layer; and forming a second TiN layer of the upper electrode on the oxidized TiN layer by using a physical vapor deposition (PVD).

According to a second embodiment of the present invention, there is provided a capacitor of a semiconductor device including: a lower electrode formed over a semiconductor substrate; a dielectric layer containing a Ta element formed on the lower electrode; and an upper electrode formed on the dielectric layer. The upper electrode has an oxidized layer and a titanium containing layer. The oxidized layer is between the TiN layer and the dielectric layer. Additionally, the dielectric layer has an absorption region where the dielectric layer has absorbed a precursor such as $TiCl_4$ during atomic vapor deposition (AVD).

These and other objects of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

A preferred embodiment of the present invention relates to a capacitor and method of fabricating a capacitor having a lower electrode, a Ta-contained-dielectric layer, such as $Ta_2O_5$ and TaON, and an upper electrode. Each of the lower electrode and the upper electrode is a charge storage electrode and a cell plate. The lower electrode may be formed in various structures, such as a simple stack structure, a cylinder structure, a multi-fin structure and a concave structure.

Figure 6:
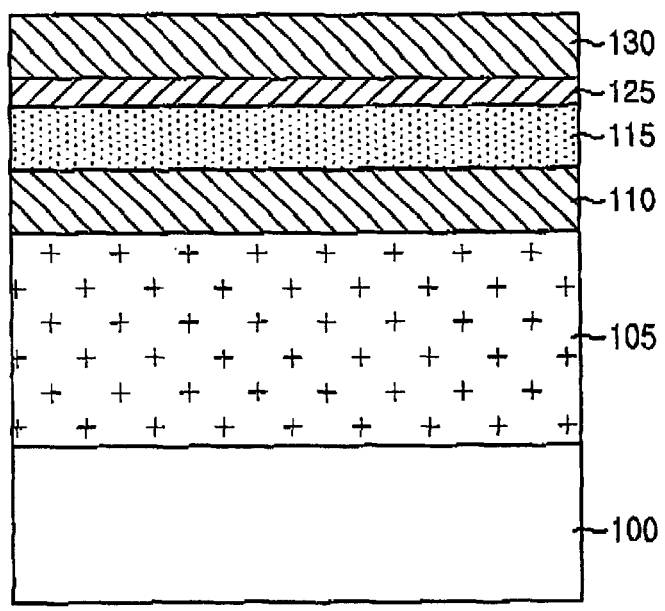

One embodiment of a capacitor formed by the method of fabricating a capacitor according to one embodiment of the present invention as shown in FIG. 6. The structure of the capacitor includes a semiconductor substrate 100 over which a polysilicon plug 105 is formed. A lower electrode 110 is formed over the polysilicon plug 105, and a dielectric layer 115 is formed over the lower electrode 110. An upper electrode is formed over the dielectric layer 105 and includes a TiN layer 130 formed over a TiON layer 125.

An upper electrode of a capacitor may be formed, according to one embodiment of the present invention, as follows. A first TiN layer is formed with the atomic layer deposition (ALD) method. The TiN layer is oxidized with plasma of an $O_2$ gas to form a TiON layer. A second TiN layer is formed on the TiON layer using a process such as the physical vapor deposition method. Preferably, the first TiN layer and the TiON layer may be formed in-situ, namely in the same chamber.

With the upper electrode formed with the above-mentioned method, it is possible to reduce leakage current generated by deoxidized Ta elements remaining at the interface between the tantalum-contained-dielectric layer and the TiN layer. Moreover, it is possible to prevent the tantalum-contained-dielectric layer from being deteriorated by Cl radicals because the first TiN layer, which is contacting the tantalum-contained-dielectric, is formed with ALD, and thus the Cl radicals are not contained in the first TiN layer. Therefore, the electric characteristic of tantalum-contained dielectric layer may be improved.

Hereinafter, a semiconductor memory device fabrication method according to embodiments of the present invention will be described in detail referring to the accompanying Figures.

Figure 1:
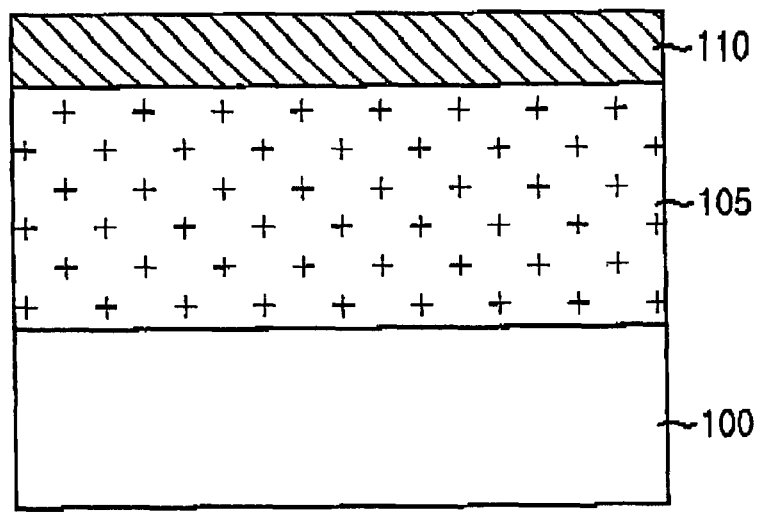
FIGS. 1 to 6 are cross sectional views showing a method for forming a capacitor according to the present invention.

First, Referring to FIG. 1, a polysilicon plug 105 is formed on a semiconductor substrate 100 having a predetermined lower structure, and a TiN lower electrode 110 connected to the polysilicon plug 105 is formed. The predetermined lower structure includes an isolation layer and a MOSFET transistor including a gate oxide, gate electrode and source/drain. After forming the polysilcon silicon plug 105, the surface of the polysilicon plug is etched with a HF solution or a buffered oxide etchant (BOE) solution to remove a native oxide. The lower electrode 110 may be formed after forming a Ti layer as a glue layer and a TiN layer as a diffusion barrier on the polysilicon plug 105.

Figure 2:
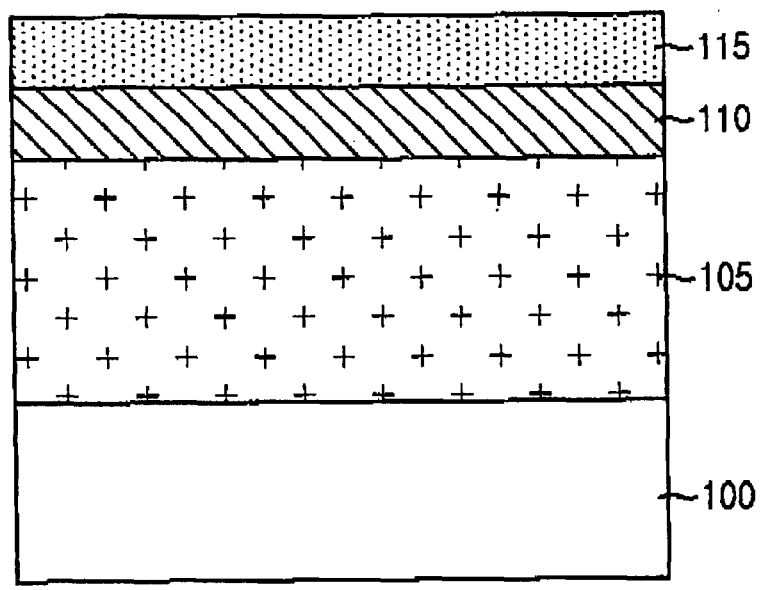
Figure 3:
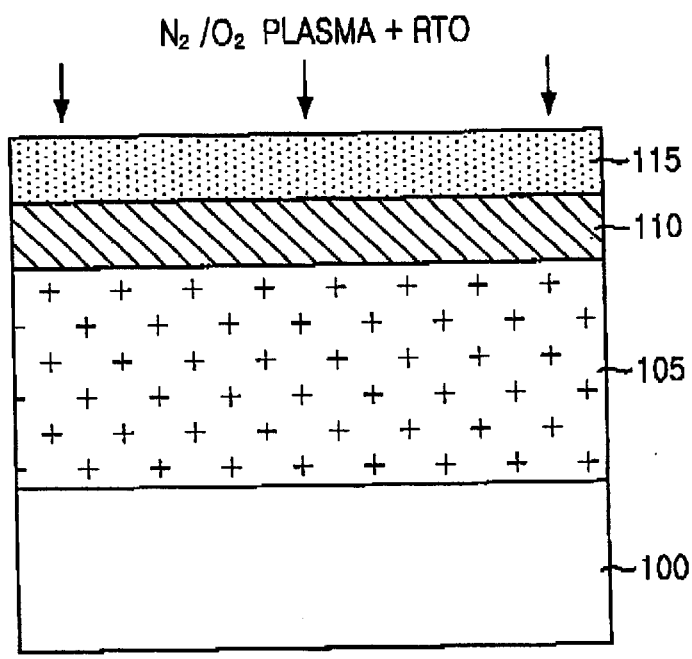

Referring to FIG. 2, a dielectric layer 115 including Ta element, such as a TaON layer and a $Ta_2O_5$ layer, is formed on the lower electrode 110. In the preferred embodiment of the present invention, the dielectic layer 115 is formed with a TaON layer, which is formed in the following conditions. A reaction source $Ta(OC_2H_5)_5$ for forming TaON is vaporized in a vaporizer maintaining a temperature of about 170–190° C., because the state of the $Ta(OC_2H_5)_5$ source is liquid at the room temperature. An $NH_3$ reaction gas is flowed at rates of 10–1000 sccm and the pressure of the chamber is maintained at the ranges of 0.1–2 Torr. The dielectric layer 115 is formed on a wafer heated to 300–400° C.

Subsequently, the dielectric layer 115 is annealed in an ambient of oxygen. For example, a plasma treatment is performed at a temperature of about 300–500° C. for about 1–5 minutes using a $N_2$ gas and an $O_2$ gas, to remove oxygen vacancies and carbon in the dielectric layer 115. The plasma treatment can be replaced with other treatments such as an ultraviolet-ozone (UV-$O_3$) treatment. After the plasma treatment or the UV-$O_3$, a rapid thermal oxidation (RTO) process is performed at a temperature of about 500–650° C. for about 30–60 seconds using a $N_2$ gas and a $O_2$ gas, for the purpose of stabilizing the interface of the dielectric layer 115 and the lower electrode 110 and increasing the inductive capacity of the dielectric layer 115 by crystallizing the dielectric layer 115.

Figure 4:
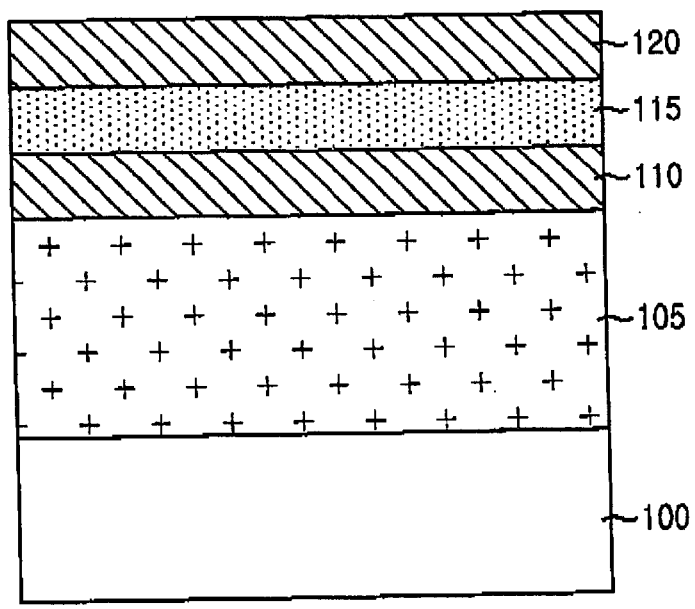

Thereafter, as shown in FIG. 4, a first TiN layer 120 is deposited on the dielectric layer 115 using ALD. The ALD is similar to conventional chemical vapor deposition (CVD). However, the ALD differs from CVD, in that precursors of the ALD react on the surface of a substrate and precursors of the CVD react in a vapor state. In ALD, a first type of precursor is supplied into a reaction chamber and is absorbed at chemically absorbable sites on a substrate, which in this embodiment includes the dielectric layer 115, and the remnants of the first precursor are purged from the reaction chamber. A second type of precursor is supplied in the reaction chamber and absorbed at sites on the substrate. Therefore, a layer may be deposited with uniform growth rate. For example, an ALD cycle may include the steps of supplying precursor A; purging with $N_2$ gas or Ar gas;

supplying precursor B and purging with $N_2$ gas or Ar gas, which are performed repeatedly to deposit a layer. The growth rate is determined by a thickness of a layer deposited for one cycle. Accordingly, it is possible to obtain uniform thickness and good step coverage with ALD using the surface reaction.

In one embodiment of the present invention, one deposition cycle of the ALD includes, for example, the steps of flowing $TiCl_4$ gas; purging with $N_2$ gas or Ar gas; flowing $NH_4$ gas; and purging with $N_2$ gas or Ar gas. The reaction chamber is maintained at a temperature of 200–400° C. and a pressure of 10 mTorr–10 Torr. The delivery time of the $TiCl_4$ gas is controlled at about 0.1–60 seconds, and the $NH_4$ gas is flowed for about 0.1–60 seconds.

Figure 5:
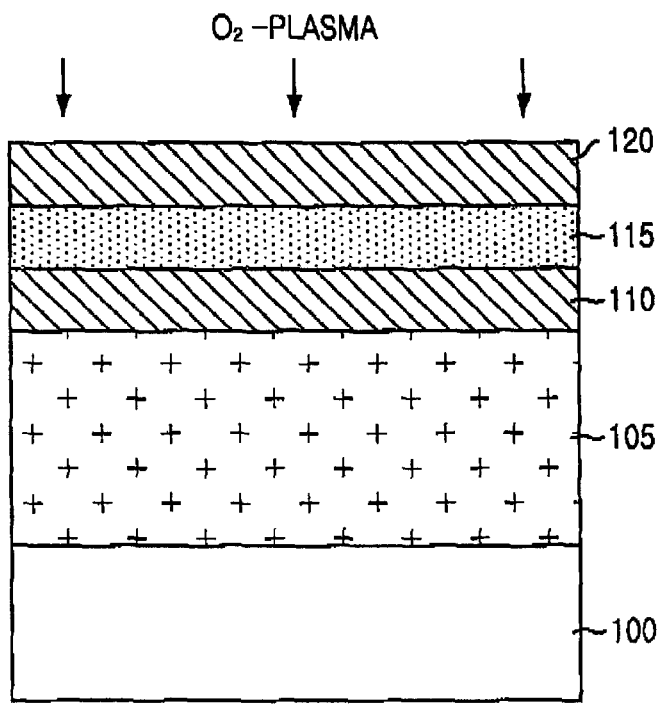

Referring to FIG. 5, the first TiN layer 120 is oxidized in order to form a TiON layer 125. At this time, $O_2$ gas at about 10–1000 sccm is flowed into a chamber and excited to form plasma. During oxidation, the pressure of the chamber is maintained at 0.1–2 Torr, and the RF power is maintained at about 3–400 watts. The first TiN layer 120 is oxidized for a few seconds to several hundreds of seconds. All or portions of the first TiN layer 120 may be oxidized by controlling the thickness of the first TiN layer or the process time for oxidizing. The process for forming the first TiN layer 120 and the process for oxidizing may be performed in-situ.

Referring to FIG. 6, a second TiN layer 130 is formed on the TiON layer 125 with physical vapor deposition (PVD). If portions of the first TiN layer 120 are oxidized, the second TiN layer 130 may be in contact with the first TiN layer 120.

In the meantime, in the above-mentioned embodiment showing the formation method of the capacitor having a MIN structure, both lower and upper electrodes are formed of TiN, however the lower electrode may be formed of Ru, Pt, Ir, Os, W, Mo, Co, Ni, Au, Ag, $RuO_2$ or $IrO_2$, etc. Also, the lower electrode may be formed with a doped polysilicon layer to form a capacitor having the MIS structure.

With the present invention mentioned above, it is possible to prevent the tantalum-contained dielectric layer from deteriorating, because the tantalum-contained dielectric layer is in contact with the first TiN deposited by ALD and all or portions of the first TiN layer are oxidized with $O_2$ plasma to form the TiON layer which is capable of suppressing the leakage current generated by the deoxidized Ta elements.

Moreover, by forming the first TiN layer with ALD, the step coverage problem, which occurs by the increase of the capacitor height, may be solved, and the damage of the tantalum-contained dielectric layer owing to Cl radicals may be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a capacitor of a semiconductor device, comprising the steps of:

forming a lower electrode on a semiconductor substrate;

forming a dielectric layer containing Ta element on the lower electrode;

forming a first TiN layer of an upper electrode on the dielectric layer by using atomic layer deposition;

forming an oxidized TiN layer by performing an oxidation process on the dielectric layer; and forming a second TiN layer of the upper electrode on the oxidized TiN layer by using a physical vapor deposition (PVD).

2. The method as recited in claim 1, wherein the step of forming the first TiN layer includes the step of repeating a deposition cycle, wherein the deposition cycle includes the steps of:

flowing a $TiCl_4$ gas;

purging with a $N_2$ gas or an Ar gas;

flowing a $NH_4$ gas; and purging with a $N_2$ gas or an Ar gas.

3. The method as recited in claim 2, wherein the deposition cycle is performed at a temperature of 200–400° C.

4. The method as recited in claim 2, wherein the deposition cycle is performed at a pressure of 10 mTorr–10 Torr.

5. The method as recited in claim 2, wherein the $TiCl_4$ gas is flowed for about 0.1–60 seconds.

6. The method as recited in claim 2, wherein the $NH_4$ gas is flowed for about 0.1–60 seconds.

7. The method as recited in claim 1, wherein the oxidation process is performed with an $O_2$ gas at about 10–1000 sccm.

8. The method as recited in claim 1, wherein the oxidation process is performed with an RF power of 30–1000 watts.

9. The method as recited in claim 1, wherein the oxidation process is performed at a pressure of 0.1–2 Torr.

10. The method as recited in claim 1, wherein all or portions of the first TiN layer are oxidized in the oxidation process.

11. The method as recited in claim 1, wherein the dielectric layer is formed of TaON or $Ta_2O_5$.

12. The method as recited in claim 11, wherein the step of forming the dielectric layer includes the steps of:

forming the dielectric layer using TaON; and annealing the dielectric layer in an ambient of oxygen.

13. The method as recited in claim 12, wherein the step of annealing the dielectric layer includes the steps of:

performing a first annealing with a plasma produced by a $N_2$ gas and an $O_2$ gas, or with ultraviolet and $O_3$; and performing a second annealing using a rapid thermal oxidation process with a $N_2$ gas and an $O_2$ gas.

14. The method as recited in claim 12, wherein the step of forming the dielectric layer includes using a vaporized Ta $(OC_2H_5)_5$ as a source gas.

15. The method as recited in claim 14, wherein the step of forming the dielectric layer includes using a $NH_3$ gas as a reaction gas.

16. The method as recited in claim 12, wherein the dielectric layer is formed at the pressure of 0.1–2 Torr.

17. The method as recited in claim 15, wherein the step of forming the dielectric layer includes forming the dielectric layer on the semiconductor substrate, which has been heated to a temperature of 300–400° C.

18. The method as recited in claim 13, wherein the step of the first annealing is performed at a temperature of 300–500° C. for 1–5 minutes.

19. The method as recited in claim 13, wherein the second annealing is performed at a temperature of 500–650° C. for 30–60 seconds.

* * * * *